(12) United States Patent
Choe et al.

(10) Patent No.: US 8,125,361 B2
(45) Date of Patent: Feb. 28, 2012

(54) DIGITAL-TO-ANALOG CONVERTER (DAC) CALIBRATION SYSTEM

(75) Inventors: Myung-Jun Choe, Thousand Oaks, CA (US); Munkyo Seo, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 91 days.

(21) Appl. No.: 12/834,822

(22) Filed: Jul. 12, 2010

(65) Prior Publication Data

US 2012/0007757 A1 Jan. 12, 2012

(51) Int. Cl.
*H03M 1/06* (2006.01)
(52) U.S. Cl. .......................... 341/120; 341/144
(58) Field of Classification Search .................. 341/120, 341/121, 118, 144
See application file for complete search history.

(56) References Cited

U.S. PATENT DOCUMENTS

| | | | |
|---|---|---|---|
| 6,130,632 A * | 10/2000 | Opris | 341/120 |
| 6,166,670 A * | 12/2000 | O'Shaughnessy | 341/136 |
| 6,331,830 B1 | 12/2001 | Song et al. | |
| 6,812,878 B1 | 11/2004 | Jewett et al. | |
| 7,019,677 B1 * | 3/2006 | Soman et al. | 341/144 |
| 7,042,379 B2 | 5/2006 | Choe | |

OTHER PUBLICATIONS

Bugeja, A.R. Bang-Sup Song, "A self-trimming 14-b 100-MS/s CMOS DAC," IEEE J. Solid-State Circuits, vol. 35, No. 12, pp. 1841-1852. Dec. 2000.

* cited by examiner

*Primary Examiner* — Brian Young
(74) *Attorney, Agent, or Firm* — Snell & Wilmer LLP

(57) ABSTRACT

The present invention relates generally to a digital-to-analog converter (DAC) calibration. The present invention may be implemented by a DAC calibration system including a first current source, a first switch coupled to the first current source, a second current source, a second switch coupled to the second current source, an output node coupled to the first switch and the second switch, a first calibration module coupled to the output node, an average current measurement module coupled to the first calibration module, and a second calibration module coupled to the average current measurement module.

20 Claims, 10 Drawing Sheets

DIGITAL-TO-ANALOG CONVERTER (DAC) CALIBRATION SYSTEM

STATEMENT REGARDING GOVERNMENT RIGHTS

This invention was made with Government support under Contract No. G.O. 73306 awarded to Rockwell Scientific Company, LLC (now known as Teledyne Scientific & Imaging, LLC) by the U.S. Army Research Development and Engineering Command (RDECOM) Army Research Laboratory (ARL) on behalf of the Defense Advanced Research Projects Agency (DARPA) Microsystems Technology Office (MTO) and the DARPA MTO Compound Semiconductor Materials on Silicon Mixed Signal Products (COSMOS). The Government has certain rights in this invention.

BACKGROUND

1. Field

The present invention relates generally to the field of digital-to-analog converters (DACs), and more particularly to techniques for automatically calibrating the current switch elements of the DACs.

2. Description of Related Art

Demand for high speed and high resolution DACs continues to grow, driven primarily by strong growth in the markets for wired and wireless communications. In one high speed and high resolution DAC architecture, the DAC receives a digital input sequence which represents a desired output current, and the current source switch elements are selectively turned on and off to provide the desired output current. In order to provide a linear output current, the current source switch elements should each produce a matching current.

One problem that may potentially hamper the performance of the high speed and high resolution DAC is the current source switch element mismatch. To detect and/or correct the current source element mismatch, attempts have been made in the past to measure the output current at the source node of the current source switch element. However, because the source node current measurement does not necessarily reflect the mismatch caused by the current source switch element and the associated weighting network, the source node calibration method fails to address the mismatch problem fully. A better position to take output current measurement may be the output node of the DAC, although it is generally difficult to separate the target current source switch element from the other current source switch elements.

Thus, there is a need for a DAC calibration system that measures and corrects the mismatch of the current source switch elements at the output node of the DAC.

SUMMARY

In one embodiment, the present invention may be implemented by a digital-to-analog converter (DAC) calibration system including a multiplexer receiving a digital input sequence and outputting a first digital signal and a plurality of second digital signals, wherein the first digital signal is orthogonal to the second digital signals, a first current source switch (CSS) element having a first current source configured to generate a first output current having a first output current magnitude controlled by a bias voltage applied to the first current source, a first current switch configured to receive the first digital signal and convert the first output current received from the first current source to a first output current pulse based on the first digital signal, and a first weighting network configured to scale the first output current pulse based on a predetermined first weighting factor, a plurality of second current source switch (CSS) elements each having a second current source configured to generate a second output current controlled by the bias voltage applied to the second current source, a second current switch configured to receive the respective second digital signal and convert the second output current received from the second current source to a second output current pulse based on the respective second digital signal, and a second weighting network configured to scale the second output current pulse based on a predetermined second weighting factor, an output node coupled to the first weighting network and the second weighting networks, receiving the first output current pulse and the second current pulses, the combination of which forms a total output current pulse, a resistive element coupled between the output node and a ground source, conducting the total output current pulse to the ground source to produce an output voltage on the output node, a first calibration module configured to receive the first digital input and convert the output voltage to a target voltage having an average output voltage value that reflects the first output current magnitude, an average measurement module coupled to the first calibration module and configured to measure the average output voltage value, and a second calibration module coupled to the average measurement module and configured to compare the average output voltage value with a predefined voltage value and adjust the bias voltage to control the first current source and the second current sources.

In another embodiment, the present invention may be implemented by a digital-to-analog converter (DAC) calibration system including a first current source configured to generate a first output current having a first output current magnitude controlled by a bias voltage applied to the first current source, a first switch configured to receive a first digital signal and convert the first output current received from the first current source to a first output current pulse based on the first digital signal, a second current source configured to generate a second output current having a second output current magnitude controlled by the bias voltage applied to the second current source, a second switch configured to receive a second digital signal and convert the second output current received from the second current source to a second output current pulse based on the second digital signal, an output node coupled to the first switch and the second switch, and for receiving the first output current pulse and the second output current pulse, the combined first and second current pulses forming a total current pulse, a first calibration module configured to receive the first digital signal and convert the total current pulse received from the output node to a target current pulse having an average current value, an average current measurement module coupled to the first calibration module configured to measure the average current value, and a second calibration module coupled to the average current measurement module and configured to compare the average current value with a predefined current value and adjust the bias voltage to control the first current source and the second current source.

In yet another embodiment, the present invention may be implemented by a method for calibrating a digital-to-analog converter (DAC) including the steps of applying a bias voltage to a first current source and a second current source such that the first current source generates a first output current having a first output current magnitude and the second current source generates a second output current having a second output current magnitude, applying a first digital signal to a first switch, in which the first output current is received and converted to a first output current pulse based on the first digital signal, applying a second digital signal to a second switch, in which the second output current is received and converted to a second output current pulse based on the second digital signal, wherein the first digital signal is orthogonal to the second digital signal, forming a total current pulse by combining the first output current pulse with the second output current pulse, masking the total current pulse with the first digital signal to form a pre-measured current pulse, measuring an average current value of the pre-measured current pulse, comparing the average current value to a predefined current value to obtain a differentiation value, and adjusting the bias voltage according to the differentiation value.

BRIEF DESCRIPTION OF THE DRAWINGS

Other systems, methods, features and advantages of the present invention will be or will become apparent to one with skill in the art upon examination of the following figures and detailed description. It is intended that all such additional systems, methods, features and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Apparatus, systems and methods that implement the embodiment of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between reference elements. In addition, the first digit of each reference number indicates the figure in which the element first appears.

Figure 1:
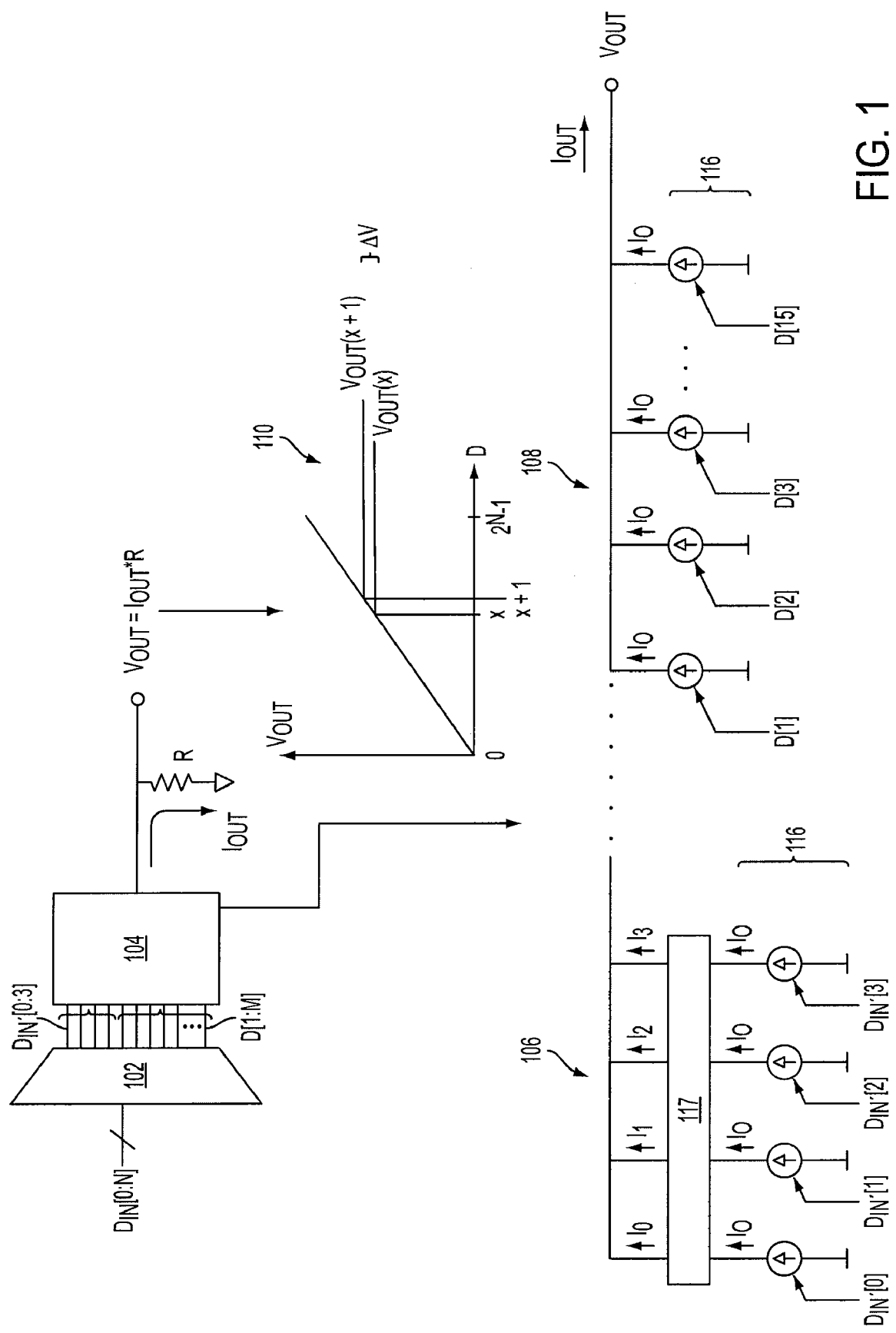
FIG. 1 shows a high level block diagram of an exemplary digital-to-analog converter (DAC) according to an embodiment of the present invention.

FIG. 1 shows a high level block diagram of an exemplary DAC, which may include an encoder 102 and an analog module 104. The encoder 102 may map a digital input sequence $D_{IN}[0:N]$ to produce an array of digital signals D[1:M], where N+1 denotes the bit width of the digital sequence in binary bits and M can be a function of N. Moreover, the encoder 102 may bypass a portion of the digital input sequence $D_{IN}[0:N]$ to form the bypassed digital input sequence $D_{IN}'$. Each digital signal D or bypassed digital input sequence $D_{IN}'$ may be coupled to one or more current source switch (CSS) elements 116 located inside the analog module 104. According to an embodiment of the present invention, each CSS element 116 may be turned on and off by one or more digital signals D and the bypassed digital input sequence $D_{IN}'$ such that it may generate an output current $I_O$ based on a bias voltage (not shown). The output currents $I_O$ generated by each CSS element should match one another and have a uniform magnitude $M_O$. As shown in FIG. 1, the CSS elements 116 may be arranged in parallel to deliver a total output current $I_{OUT}$ to an output node, at which a load resistor R may conduct the total output current $I_{OUT}$ to a ground source, thereby establishing an output voltage $V_{OUT}$.

One of the many design goals of the DAC is to have a linear output voltage $V_{OUT}$ corresponding to the bypassed digital input sequence $D_{IN}'$. That is, the $V_{OUT}$ value should increase linearly with the increasing decimal value represented by the bypassed digital input sequence $D_{IN}'$. For example, Table 1 below may illustrate the concept of linearity.

TABLE 1

Digital input with linear output voltage.

| $D_{IN}'[3:0]$ | Decimal Value | $V_{OUT}$ Value (V) |
|---|---|---|
| 0000 | 0 | 0.0 |
| 0001 | 1 | 0.5 |
| 0010 | 2 | 1.0 |
| 0011 | 3 | 1.5 |
| 0100 | 4 | 2.0 |
| 0101 | 5 | 2.5 |
| 0110 | 6 | 3.0 |
| 0111 | 7 | 3.5 |
| 1000 | 8 | 4.0 |
| 1001 | 9 | 4.5 |
| 1010 | 10 | 5.0 |
| 1011 | 11 | 5.5 |
| 1100 | 12 | 6.0 |
| 1101 | 13 | 6.5 |
| 1110 | 14 | 7.0 |
| 1111 | 15 | 7.5 |

As shown in Table 1, each bypassed digital input sequence $D_{IN}'[0:3]$ combination has a corresponding decimal value, which in turn may have a corresponding $V_{OUT}$ value. The voltage difference $\Delta V$ between the successive output voltages $V_{OUT}(x)$ and $V_{OUT}(x+1)$ should be a constant, which is 0.5V in this case. Hence, the output voltage $V_{OUT}$ may increase linearly with the increasing decimal value represented by the bypassed digital input sequence $D_{IN}'[10:3]$, combination as shown in the plot diagram 110.

According to an embodiment of the present invention, one way to achieve linearity is to assign one CSS element 116 to each bypassed digital input sequence $D_{IN}'$ signal and to scale the output current $I_O$ of each CSS element accordingly. For example, the CSS segment 106 includes a series of CSS elements 116, each of which may be turned on or off separately by a digital signal $D_{IN}$. The output current $I_O$ of each CSS element 116 is scaled by a weighting network 117 with a weighting factor. According to an embodiment of the present invention, the weighting network 117 may have a weighting factor of ½, such that $I_0=½I_1$, $I_1=½I_2$, and so forth. Table 2 below may illustrate the implementation of this scheme.

TABLE 2

Exemplary total output current based on several scaled output currents.

| Decimal Value | $I_3 I_2 I_1 I_0$ | $I_{OUT}$ (A) |
| --- | --- | --- |
| 0 | 0000 | 0.000 |
| 1 | 0001 | 0.125 |
| 2 | 0010 | 0.250 |
| 3 | 0011 | 0.375 |
| 4 | 0100 | 0.500 |
| 5 | 0101 | 0.625 |
| 6 | 0110 | 0.750 |
| 7 | 0111 | 0.875 |
| 8 | 1000 | 1.000 |
| 9 | 1001 | 1.125 |
| 10 | 1010 | 1.250 |
| 11 | 1011 | 1.375 |
| 12 | 1100 | 1.500 |
| 13 | 1101 | 1.625 |
| 14 | 1110 | 1.750 |
| 15 | 1111 | 1.875 |

Referring to Table 2, a zero on the $I_0$ column indicates that the CSS element 116 outputting the scaled output current $I_0$ is turned off, and a one on the $I_0$ column indicates that the CSS element 116 outputting the scaled output current $I_0$ is turned on. For example, a "0101" combination indicates that the CSS elements 116 outputting $I_0$ and $I_2$ are turned on while the CSS elements 116 outputting $I_1$ and $I_3$ are turned off. According to an embodiment of the present invention, $I_0$ may be about 0.125 A, $I_1$ may be about 0.250 A, $I_2$ may be about 0.500 A, and $I_3$ may be about 1 A. Because the output voltage $V_{OUT}$ is a product of the total output current $I_{OUT}$ and the load resistor R, a linear total output current $I_{OUT}$ may lead to a linear output voltage $V_{OUT}$ if the load resistor R remains constant over the operative range of the total output current $I_{OUT}$.

Although the CSS segment 106 has four CSS elements and a weighting network 117 with a weighting factor of ½, the analog module 104 may include several CSS segments with different numbers of CSS elements 116 coupled to different weighting networks according to various embodiments of the present invention.

According to an alternative embodiment of the present invention, another way to achieve linearity is to encode the digital input sequence $D_{IN}[0:N]$ to form a digital signal bus D[1:M] and each digital signal D can turn on one CSS elements 116, each of which has its output current $I_O$ directly delivered to the output node to form the total output current $I_{OUT}$. Table 3 and Table 4 below may illustrate the implementation of the encoding scheme.

TABLE 3

Exemplary Encoding Scheme.

| $D_{IN}[3:0]$ | | | | D1 | D2 | D3 | D4 | D5 | D6 | D7 | D8 | D9 | D10 | D11 | D12 | D13 | D14 | D15 |
| --- | --- | --- | --- | --- | --- | --- | --- | --- | --- | --- | --- | --- | --- | --- | --- | --- | --- | --- |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 1 | 0 | 0 | 0 | 0 | 0 | 0 | 0 | 0 | 0 | 0 | 0 | 0 | 0 | 0 |
| 0 | 0 | 1 | 0 | 1 | 1 | 0 | 0 | 0 | 0 | 0 | 0 | 0 | 0 | 0 | 0 | 0 | 0 | 0 |
| 0 | 0 | 1 | 1 | 1 | 1 | 1 | 0 | 0 | 0 | 0 | 0 | 0 | 0 | 0 | 0 | 0 | 0 | 0 |
| 0 | 1 | 0 | 0 | 1 | 1 | 1 | 1 | 0 | 0 | 0 | 0 | 0 | 0 | 0 | 0 | 0 | 0 | 0 |
| 0 | 1 | 0 | 1 | 1 | 1 | 1 | 1 | 1 | 0 | 0 | 0 | 0 | 0 | 0 | 0 | 0 | 0 | 0 |
| 0 | 1 | 1 | 0 | 1 | 1 | 1 | 1 | 1 | 1 | 0 | 0 | 0 | 0 | 0 | 0 | 0 | 0 | 0 |
| 0 | 1 | 1 | 1 | 1 | 1 | 1 | 1 | 1 | 1 | 1 | 0 | 0 | 0 | 0 | 0 | 0 | 0 | 0 |
| 1 | 0 | 0 | 0 | 1 | 1 | 1 | 1 | 1 | 1 | 1 | 1 | 0 | 0 | 0 | 0 | 0 | 0 | 0 |
| 1 | 0 | 0 | 1 | 1 | 1 | 1 | 1 | 1 | 1 | 1 | 1 | 1 | 0 | 0 | 0 | 0 | 0 | 0 |
| 1 | 0 | 1 | 0 | 1 | 1 | 1 | 1 | 1 | 1 | 1 | 1 | 1 | 1 | 0 | 0 | 0 | 0 | 0 |
| 1 | 0 | 1 | 1 | 1 | 1 | 1 | 1 | 1 | 1 | 1 | 1 | 1 | 1 | 1 | 0 | 0 | 0 | 0 |
| 1 | 1 | 0 | 0 | 1 | 1 | 1 | 1 | 1 | 1 | 1 | 1 | 1 | 1 | 1 | 1 | 0 | 0 | 0 |
| 1 | 1 | 0 | 1 | 1 | 1 | 1 | 1 | 1 | 1 | 1 | 1 | 1 | 1 | 1 | 1 | 1 | 0 | 0 |
| 1 | 1 | 1 | 0 | 1 | 1 | 1 | 1 | 1 | 1 | 1 | 1 | 1 | 1 | 1 | 1 | 1 | 1 | 0 |
| 1 | 1 | 1 | 1 | 1 | 1 | 1 | 1 | 1 | 1 | 1 | 1 | 1 | 1 | 1 | 1 | 1 | 1 | 1 |

TABLE 4

Another Exemplary Encoding Scheme.

| $D_{IN}[3:0]$ | | | | D1 | D2 | D3 | D4 | D5 | D6 | D7 | D8 | D9 | D10 | D11 | D12 | D13 | D14 | D15 |
| --- | --- | --- | --- | --- | --- | --- | --- | --- | --- | --- | --- | --- | --- | --- | --- | --- | --- | --- |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 1 | 0 | 0 | 0 | 0 | 0 | 0 | 0 | 0 | 0 | 0 | 0 | 0 | 0 | 0 |
| 0 | 0 | 1 | 0 | 0 | 1 | 1 | 0 | 0 | 0 | 0 | 0 | 0 | 0 | 0 | 0 | 0 | 0 | 0 |
| 0 | 0 | 1 | 1 | 1 | 1 | 1 | 0 | 0 | 0 | 0 | 0 | 0 | 0 | 0 | 0 | 0 | 0 | 0 |
| 0 | 1 | 0 | 0 | 0 | 0 | 0 | 1 | 1 | 1 | 1 | 0 | 0 | 0 | 0 | 0 | 0 | 0 | 0 |
| 0 | 1 | 0 | 1 | 1 | 0 | 0 | 1 | 1 | 1 | 1 | 0 | 0 | 0 | 0 | 0 | 0 | 0 | 0 |
| 0 | 1 | 1 | 0 | 0 | 1 | 1 | 1 | 1 | 1 | 1 | 0 | 0 | 0 | 0 | 0 | 0 | 0 | 0 |
| 0 | 1 | 1 | 1 | 1 | 1 | 1 | 1 | 1 | 1 | 1 | 0 | 0 | 0 | 0 | 0 | 0 | 0 | 0 |
| 1 | 0 | 0 | 0 | 0 | 0 | 0 | 0 | 0 | 0 | 0 | 1 | 1 | 1 | 1 | 1 | 1 | 1 | 1 |
| 1 | 0 | 0 | 1 | 1 | 0 | 0 | 0 | 0 | 0 | 0 | 1 | 1 | 1 | 1 | 1 | 1 | 1 | 1 |
| 1 | 0 | 1 | 0 | 0 | 1 | 1 | 0 | 0 | 0 | 0 | 1 | 1 | 1 | 1 | 1 | 1 | 1 | 1 |
| 1 | 0 | 1 | 1 | 1 | 1 | 1 | 0 | 0 | 0 | 0 | 1 | 1 | 1 | 1 | 1 | 1 | 1 | 1 |
| 1 | 1 | 0 | 0 | 0 | 0 | 0 | 1 | 1 | 1 | 1 | 1 | 1 | 1 | 1 | 1 | 1 | 1 | 1 |
| 1 | 1 | 0 | 1 | 1 | 0 | 0 | 1 | 1 | 1 | 1 | 1 | 1 | 1 | 1 | 1 | 1 | 1 | 1 |
| 1 | 1 | 1 | 0 | 0 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 1 | 1 | 1 |

For example, as shown in Table 3, Table 4, and the CSS segment 108, the digital signal $D_{IN}[0]$ may only turn on one CSS element 116, the digital signal $D_{IN}[1]$ may turn on two CSS elements 116, the digital signal $D_{IN}[2]$ may turn on four CSS elements 116, and the digital signal $D_{IN}[3]$ may turn on eight CSS elements 116. If $I_O$ equals 0.125 A, the digital signal $D_{IN}[0]$ may direct a total output current $I_{OUT}$ of about 0.125 A, the digital signal $D_{IN}[1]$ may direct a total output current $I_{OUT}$ of about 0.250 A, the digital signal $D_{IN}[2]$ may direct a total output current $I_{OUT}$ of about 0.500 A, and the digital signal $D_{IN}[3]$ may direct a total output current $I_{OUT}$ of about 1.000 A. The structure of the CSS segment 108 is similar to the structure of the CSS segment 106 except that no weighting network 117 is involved. Although the CSS segment 108 may have four weighting-network-free CSS elements, the analog module 104 may include CSS segments with different numbers of weighting-network-free CSS elements according to various embodiments of the present invention.

Figure 2:
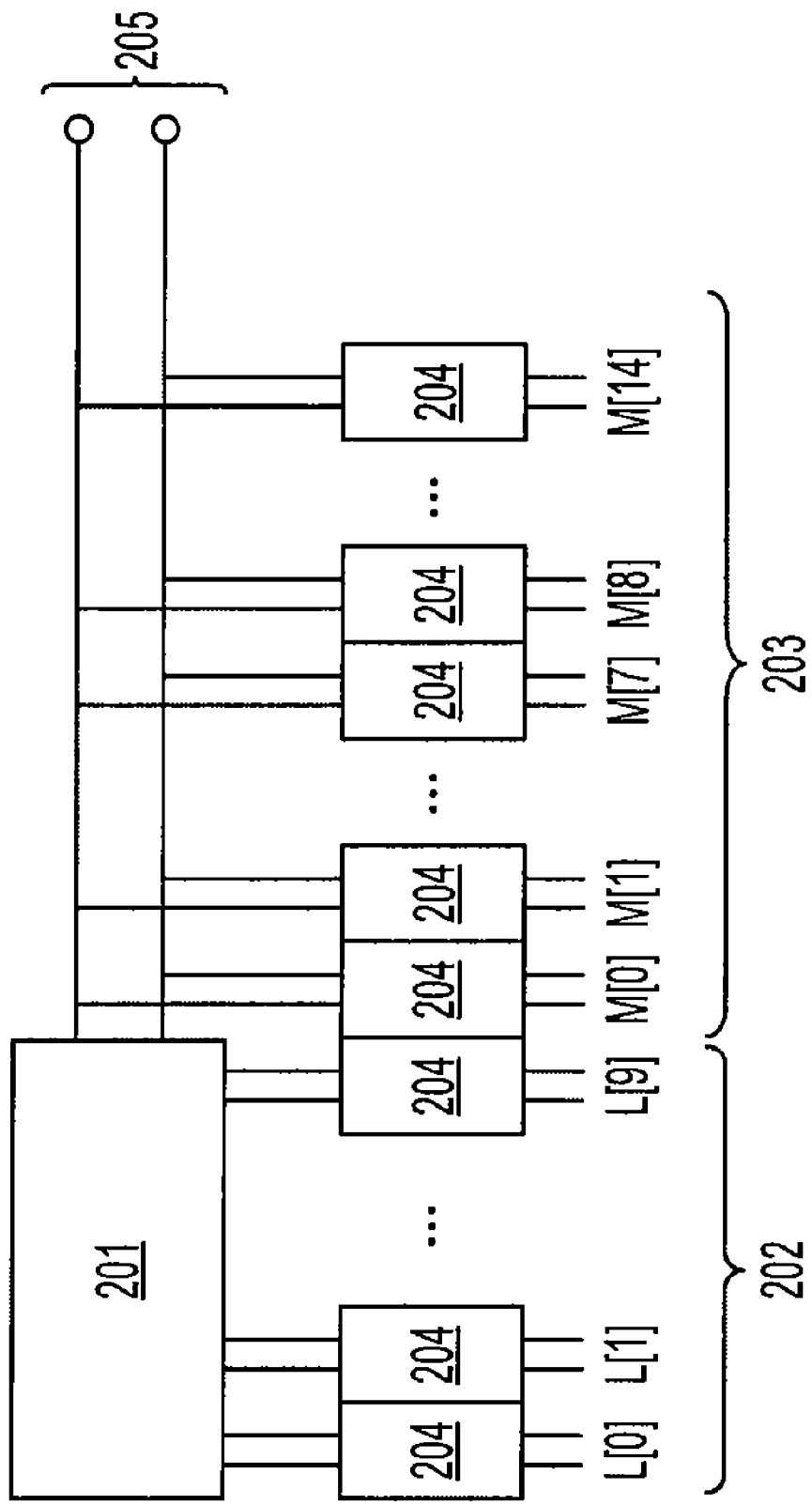
FIG. 2 shows a block diagram of the analog module according to an embodiment of the present invention.

According to yet another embodiment of the present invention, the CSS segments 106 and 108 can be combined to form a single CSS segment. For example, FIG. 2 shows a block diagram of the analog module, which may include the CSS elements 204, the weighting network 201, and their interconnectivity. The least significant bits (LSB) group 202 may have the digital signals LSB[0:9] coupled to the CSS segment 106, whereas the most significant bits (MSB) group 203 may have the digital signals MSB[0:14] coupled to the CSS segment 108. All the output currents, whether scaled or not, will be combined at the output nodes 205 to form the total output current $I_{OUT}$ and the output voltage $V_{OUT}$.

Figure 3:
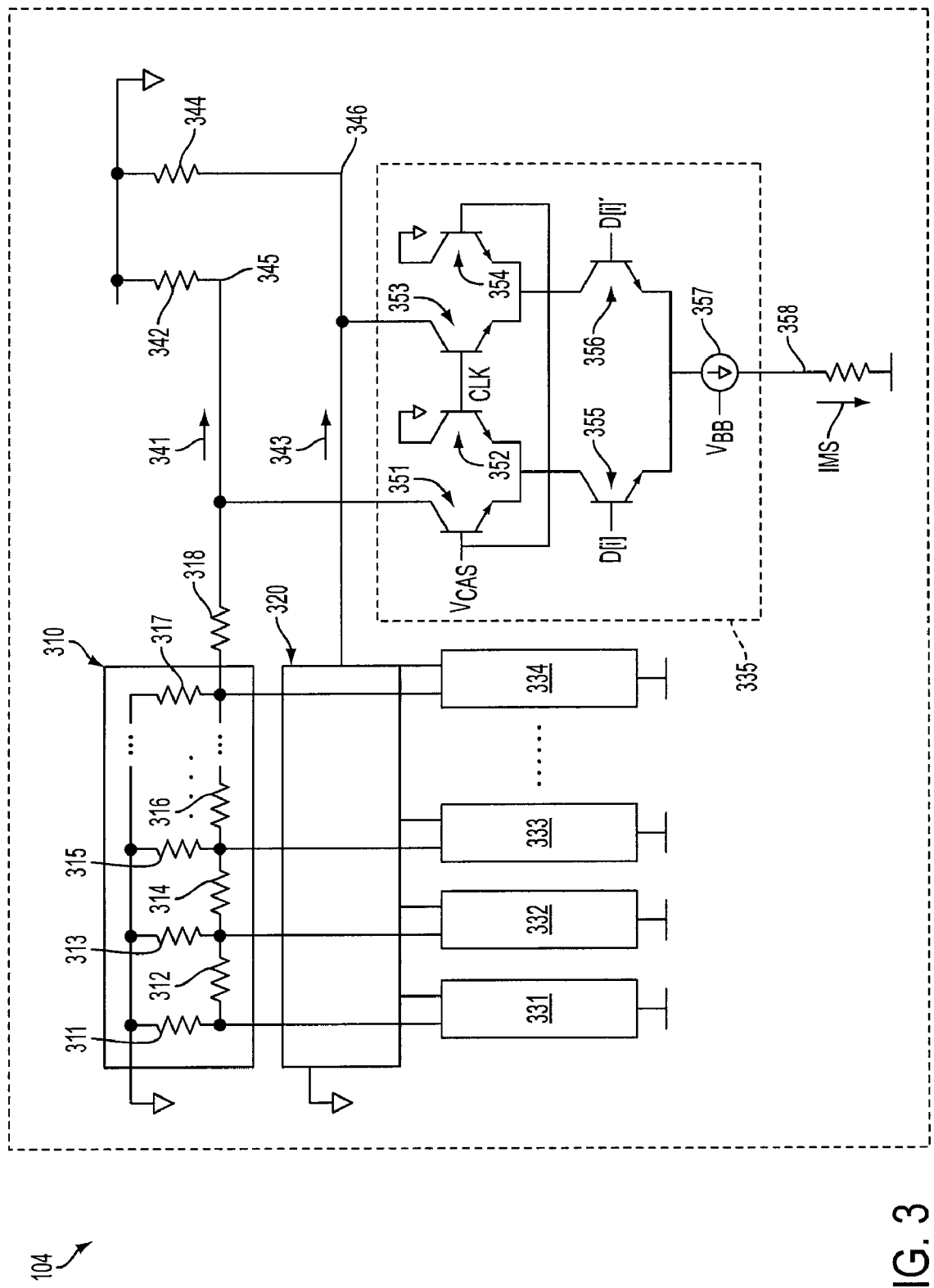
FIG. 3 shows the partial schematic view of the analog module according to an embodiment of the present invention.

FIG. 3 shows the partial schematics of the analog module, which may include the weighting network 310 and 320 and the CSS elements 331, 332, 333, 334, and 335 according to an embodiment of the present invention. Generally, each CSS element may include a current source portion and a current switch portion. The current source portion of the CSS element may be responsible for generating an output current $I_O$ with a uniform magnitude $M_O$, depending on the value of a bias voltage applied thereto. The current switch portion of the CSS element may be responsible for switching the polarity of the output current at a particular time, depending on the values of certain digital signals. Referring to the CSS element 335, the transistors 355 and 356 may carry out the switching function by responding to a pair of differential digital inputs D[i] and D[i]', the transistors 352 and 353 may be responsible for synchronizing the switching function with a system clock signal CLK, the gate of the current source 357 may be adjusted by the bias voltage $V_{BB}$ to increase or decrease the magnitude of the output current, and the transistors 351 and 354 may be controlled by a constant bias voltage $V_{CAS}$ for passing the output current.

Although the digital signals D[i] and D[i]' are used to control CSS element 335, other digital signals may be used to control other CSS elements 331, 332, 333, and 334. For example, several digital stimulus signals from a calibration logic module, which will be discussed later in detail, may control any of the CSS elements as well. Moreover, the partial schematic discussed herein is simplified for illustrating several aspects of the present invention and it should not be construed as the only way to implement the CSS element.

Referring to the weighting network 310, the resistors 311, 312, 313, 314, 315, 316, 317, and 318 may form an attenuation ladder to scale the output currents generated by the CSS elements 331, 332, 333, and 334. More specifically, the attenuation ladder may include resistor divider network for each CSS element and thus scale down the output current contributions of each CSS element at the output nodes 345 and 346. According to an embodiment of the present invention, the resistor 311, 312, 314, 316, and 318 may have the same resistance R1, and the resistors 313, 315 and 317 may have the same resistance R2, such that R2 is two times of R1. The R2-R1 ratio produces a weighting factor of one half.

Although FIG. 3 shows that the weighting network 310 has a weighting factor of ½, the weighting network 310 may have other weighting factors. According to various embodiments of the present invention, the weighting network 310 may have the weighting factors of 4, 2, ⅓ and/or ¼. Moreover, the analog module 104 discussed herein may adopt different weighting factors for different CSS segments. Furthermore, according to an alternative embodiment of the present invention, the weighting network 310 may scale the output current by diverting a portion of the output current away from the output node instead of limiting the drain voltage of the CSS elements.

Referring to the output nodes 345 and 346, they may be coupled to the load resistors 342 and 344 which may conduct the total output currents 341 and 343 to a ground source, thereby allowing the build up of a differential pair of output voltages $V_{OUT}$ and $V_{OUT}'$. The load resistors 342 and 344 may be included in the DAC system or installed in an external device (not shown). As such, the load resistors 342 and 344 may or may not be necessary to carry out the overall functionalities of the DAC.

In one embodiment, the DAC needs to meet at least two conditions in order to provide a linear DAC output. First, the output current from each CSS element needs to match one another such that each CSS element may generate the same amount of output current. Second, the weighting network needs to scale these output currents properly according to the designated weighting factor. However, due to several process limitations and parasitic effects, the CSS elements may or may not provide matching output currents and the weighting network may or may not scale the output currents properly.

To ensure better matching and accurate scaling, a calibration system may be implemented to measure and correct any nonlinearity caused by the CSS elements and the weighting network. Referring again to FIG. 3, the output current of the CSS element 335 may be measured at a source node 358. The source node measured current $I_{MS}$ may reflect and track the output current $I_O$ because both of them are originated from the current source 357. However, the source node measured current $I_{MS}$ may not account for the parasitic effects and the matching problems of the transistors 355, 356, 351, 352, 353, and 354. Specifically, the actual output current $I_O$ may be less symmetric and substantially weaker than the source node measured current $I_{MS}$. Accordingly, the source node measured current $I_{MS}$ may or may not reflect the nonlinearity behavior of the CSS elements.

Moreover, for those output currents $I_O$ are scaled by the weighting network 317, the source node measured current $I_{MS}$ becomes insufficient for detecting any inaccurate scaling caused by the weighting network 317. Specifically, the weighting network 317 may fail to provide the designated weighting factor because the resistors 311 and 312 may have resistances that substantially deviate from R1 and the resistors 313, 314, 315, 316, 317, and 318 may have resistances that substantially deviate from R2. As a result, the attenuation ladder fails to achieve the R2-R1 ratio and the source node measured current $I_{MS}$ is unlikely to detect such failure.

According to another embodiment of the present invention, a DAC calibration system may measure the output currents of the CSS elements at the output node of the DAC. Unlike taking current measurement at the source node, taking measurement at the output node may detect mismatch problems at both the current switch level and the weighting network level. The major difficulty of taking measurement at the output node comes from the fact that all the output currents are combined at the output node such that the target output current may or may not be readily measurable. Hence, it is important to have a calibration scheme that can isolate and measure the target output current at the output node while ignoring the other output currents.

According to an embodiment of the present invention, several stimulus schemes may be deployed to isolate and measure the target output current from the other output currents at the output node. For example, one scheme may involve applying a first digital signal to the target CSS element and a second digital signal to the other CSS elements, where the first digital signal is orthogonal to the second digital signal. As defined herein, two digital signals, X(t) and Y(t), are orthogonal to each other if they satisfy the condition of Equation 1, which recites:

$$\int [X(t)-M_x][Y(t)-M_y]dt=0$$

where $M_x$ is the average of X(t), and $M_y$ is the average of Y(t) over time.

For example, the digital signal X(t) may have a high state value from time periods one to two and a low state value from time periods three to four, whereas the digital signal Y(t) may have a low state value from time periods one to two and a high state value from time periods three to four. If the stimulus scheme is operating in a differential mode, the high state value may be substantially close to positive one while the low state value may be substantially close to negative one. Similarly, if the stimulus scheme is operating in a single-ended mode, the high state value may be substantially close to positive one while the low state value may be substantially close to zero. Satisfying the condition of the Equation 1, the digital signals X(t) and Y(t) are considered to be orthogonal to each other because the integral product of the digital signals X(t) and Y(t) over the time periods one to four is substantially close zero.

One purpose of applying an orthogonal pair of digital signals to the target CSS element and the other CSS elements is to create two groups of output current pulses. Because these two groups of output current pulses are embedded with the orthogonal components, they can be separately identified and measured. The implementation of this scheme will be discussed in greater detail along with FIGS. 4-8.

Figure 4:
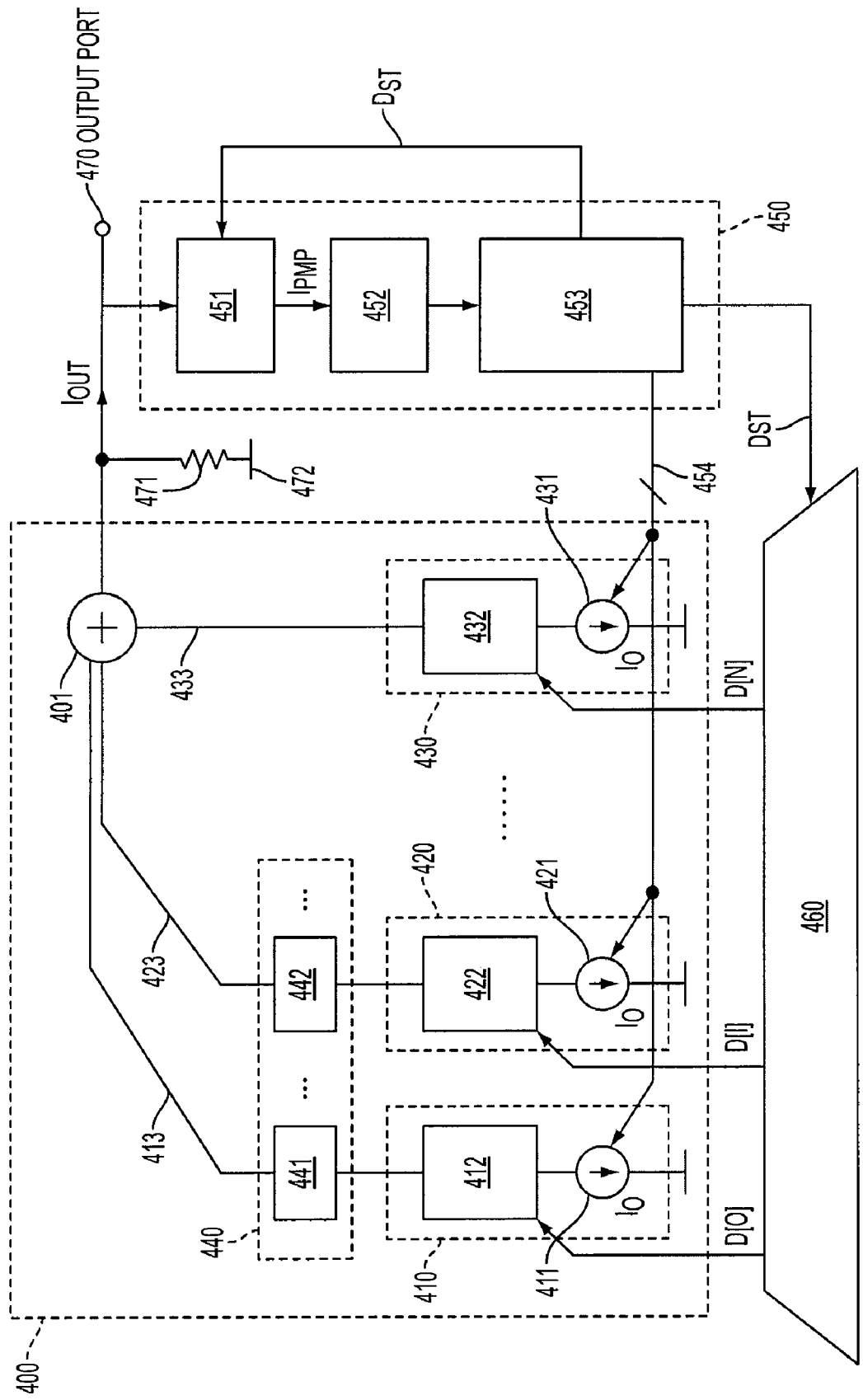
FIG. 4 shows a block diagram of the DAC with a calibration system according to an embodiment of the present invention.

FIG. 4 shows a block diagram of the DAC with a calibration system 450 designed to measure the output current $I_O$, or a scaled output current $I_{OS}$, of any CSS element at the output node 401 of the DAC. Generally, the DAC with the calibration system 450 may include an analog module 400, a multiplexer 460, a calibration demodulation module 451, an average current/voltage measurement module 452, and a calibration logic module 453.

The analog module 400 may include several CSS elements, such as the CSS elements 410, 420, and 430, a weighting network 440, and an output node 401. Although FIG. 4 only shows three CSS elements, 410, 420, and 430, it is understood that several embodiments of the present invention may have two CSS elements or more than three CSS elements as well. Similarly, although FIG. 4 shows that the weighting network 440 only scales the output currents of the CSS elements 410 and 420, it is understood that several embodiments of the present invention may have a weighting network that scales more than two output currents.

The CSS element 410 may comprise a current source 411 and a current switch 412. The primary purpose of the current source 411 is to generate a uniform output current $I_O$ that drives the output node 401. Practically, the current source 411 may also be responsible for producing the output voltage $V_{OUT}$ at the output node 401 if it is coupled to a load resistor 471 that conducts the output current $I_O$ to a ground source 472. The current source 411 may be controlled by a set of bias voltages 454 generated by the calibration logic module 453. More specifically, the set of bias voltages 454 may fine tune the current source 411 by adjusting the uniform magnitude $M_O$ of the output current $I_O$. According to an embodiment of the present invention, the current source 411 may include the current source 357 of FIG. 3, a current mirror, or any other devices capable of generating an analog current.

The primary purpose of the current switch 412 is to direct the path on which the current source 411 may deliver the output current $I_O$ to the output node 401. Practically, the current switch 412 may also shut down the current source 411 by cutting off its voltage supply. The current switch 412 may be controlled by a digital signal D generated by the multiplexer 460, which may ultimately be controlled by a digital stimulus signal $D_{ST}$ from the calibration logic module 453 when the DAC is undergoing calibration. Moreover, the current switch 412 may also be controlled by other signals in various embodiments of the present invention. For example, the calibration logic module 453 may generate a signal $V_{CAS}$ to control the current switch 412 directly. According to an embodiment of the present invention, the current switch 412 may include the transistors 355, 356, 351 and 354 of FIG. 3, a current directing switch, or any other devices properly sized and biased to direct the output current $I_O$.

Although FIG. 4 illustrates both the current source 411 and the current switch 412 as individual devices, it is understood that the current source 411 and the current switch 412 may include multiple devices as well. Moreover, it is understood that the current sources 421 and 431 serve similar functions as the current source 411, and that the current switches 422 and 432 serve similar functions as the current switch 412.

The weighting network 440 may have two sub-networks 441 and 442, which may or may not share the same weighting factor. For example, both the weighting sub-networks 441 and 442 may share the same weighting factor ½ according to an embodiment of the present invention. As such, the scaled output current $I_{OS}$ at the node 413 may be half of the scaled output current $I_{OS}$ at the node 423, and the scaled output current at the node 423 may be half of the original output current $I_O$. Conversely, the weighting sub-network 441 may have a weighting factor of ½ while the weighting sub-network ¼ may have a weighting factor of ¼ according to another embodiment of the present invention. As such, the scaled output current $I_{OS}$ at the node 413 may be half of the scaled output current $I_{OS}$ at the node 423, and the scaled output current at the node 423 may be a fourth of the original output current $I_O$. Because the weighting network 440 does not cover the CSS element 430, the output current $I_O$ from the CSS element 430 will not be scaled and it will be delivered directly to the node 433.

Although FIG. 4 shows that the weighting network 440 only scales the output currents $I_O$ of the CSS elements 410 and 412, it may scale more than two output currents of several CSS elements as well. Moreover, although FIG. 4 shows that only the CSS element 430 is not scaled, the analog module 400 may include more than one CSS elements that are not scaled as well.

Referring to the output node 401, it may receive all the scaled output currents $I_{OS}$ and the original output currents $I_O$ from all the CSS elements. As a result, a total output current $I_{OUT}$ may be formed, and it may drive the DAC output port

470. The load resistor 471 may help establish the output voltage $V_{OUT}$ by conducting the total output current $I_{OUT}$ to a ground source, thereby creating a potential difference between the output node 401 and the ground source 472. Because the resistance of the load resistor 471 is generally stable over the operative range of the total output current $I_{OUT}$, the profile of the output voltage $V_{OUT}$ may be defined by the profile of the total output current $I_{OUT}$. Therefore, the average value of the total output current $I_{OUT}$, or a part thereof, can be determined by measuring the average value of the output voltage $V_{OUT}$.

The discussion now turns to several calibration schemes performed by the calibration system 450. According to an embodiment of the present invention, the calibration system 450 may include the calibration demodulation module 451, the average current/voltage measurement module 452, and the calibration logic module 453. Generally, the calibration logic module 453 may be responsible for generating several digital stimulus signals $D_{ST}$, which may be fed directly to the current switches 412, 422, and 432, or indirectly via the multiplexer 460.

The digital stimulus signals $D_{ST}$ are purported to polarize the output currents $I_O$ by converting them into several output current pulses. Based on their respective polarities, these output current pulses can be later separated into a to-be-measured group (aka the target group) and a non-measurement group (aka the dummy group). As defined herein, $I_{TARGET}$ may denotes the output current pulse(s) from the target group of the CSS element(s), and $I_{DUMMY}$ may denotes the output current pulse(s) from the dummy group of the CSS element(s).

The digital stimulus signals $D_{ST}$ may include a pair of orthogonal digital stimulus signals $D_{ST1}$ and $D_{ST2}$. To separate the CSS elements into the target group and the dummy group, the digital signal $D_{ST1}$ may be applied to the current switch that directs the target output current pulse $I_{TARGET}$ and the digital signal $D_{ST2}$ may be applied to the current switches that direct the output current pulses $I_{DUMMY}$.

For example, if the CSS element 430 is to be measured and the CSS elements 410 and 420 are not to be measured, the digital stimulus signal $D_{ST1}$ may be applied to the current switch 432 and the digital stimulus signal $D_{ST2}$ may be applied to the current switches 412 and 422. After being polarized, the output current from the current source 432 is converted to the target output current pulse $I_{TARGET}$ whereas the output currents from the current source 411 and 421 are converted to the dummy output current pulses $I_{DUMMY}$. As a result, the target output current pulse $I_{TARGET}$ and the dummy output current pulse $I_{DUMMY}$ may be combined at the output node 401 to form a total current pulse $I_{TCP}$.

Next, the calibration demodulation module 451 may demodulate the total current pulse $I_{TCP}$ by preserving the DC component of the target current pulse $I_{TARGET}$. After the demodulation process, the calibration demodulation module 451 may output a pre-measurement current pulse $I_{PMP}$ with an average value that may substantially equal the magnitude of the target current pulse $I_{TARGET}$. According to an embodiment of the present invention, the calibration demodulation module 451 may receive the digital stimulus signal $D_{ST1}$ from the calibration logic module 453 and apply it to the incoming total current pulse $I_{TCP}$. Because the dummy output current pulse $I_{DUMMY}$ has an AC component that is orthogonal to the digital signal $D_{ST1}$, the application of the digital signal $D_{ST1}$ may remove the overall influence of the dummy output current pulse $I_{DUMMY}$. As a result, the resulting pre-measurement current pulse $I_{PMP}$ may only contain the DC component of the target current pulse $I_{TARGET}$.

The average current/voltage measurement module 452 may determine the average value of the pre-measurement current pulse $I_{PMP}$ either by measuring the pre-measurement current pulse $I_{PMP}$ directly or by measuring a pre-measurement voltage pulse $V_{PMP}$. Because the profile of the pre-measurement voltage pulse $V_{PMP}$ is defined by the profile of the pre-measurement current pulse $I_{PMP}$, the average value of the pre-measurement voltage pulse $V_{PMP}$ may substantially reflect the average value of the pre-measurement current pulse $I_{PMP}$. Even though the pre-measurement current pulse $I_{PMP}$ may still retain the AC component of the dummy output current pulse $I_{DUMMY}$, the average value of the pre-measurement current pulse $I_{PMP}$ is unlikely to reflect such component because the positive portion of the dummy output current pulse $I_{DUMMY\_P}$ is likely to cancel out the negative portion of the dummy output pulse $I_{DUMMY\_N}$. According to an embodiment of the present invention, the average value of the pre-measurement current pulse $I_{PMP}$ should be substantially close to the average value of the target current pulse $I_{TARGET}$.

The calibration logic module 453 may receive the measured average current and compare it with a predefined value. If the measured average current value is below the predefined value, the calibration logic module 453 may adjust the bias voltage 454 to increase the output current $I_O$ of the target group CSS element(s). Conversely, if the measured average current is above the predefined value, the calibration logic module 453 may adjust the bias voltage 454 to reduce the output current $I_O$ of the target group CSS element(s). The calibration process described herein may repeat until the measured average current value is substantially the same as the predefined value. When the calibration process of a target group is completed, the calibration logic module 453 may initiate the calibration process for the next target group.

Figure 5:
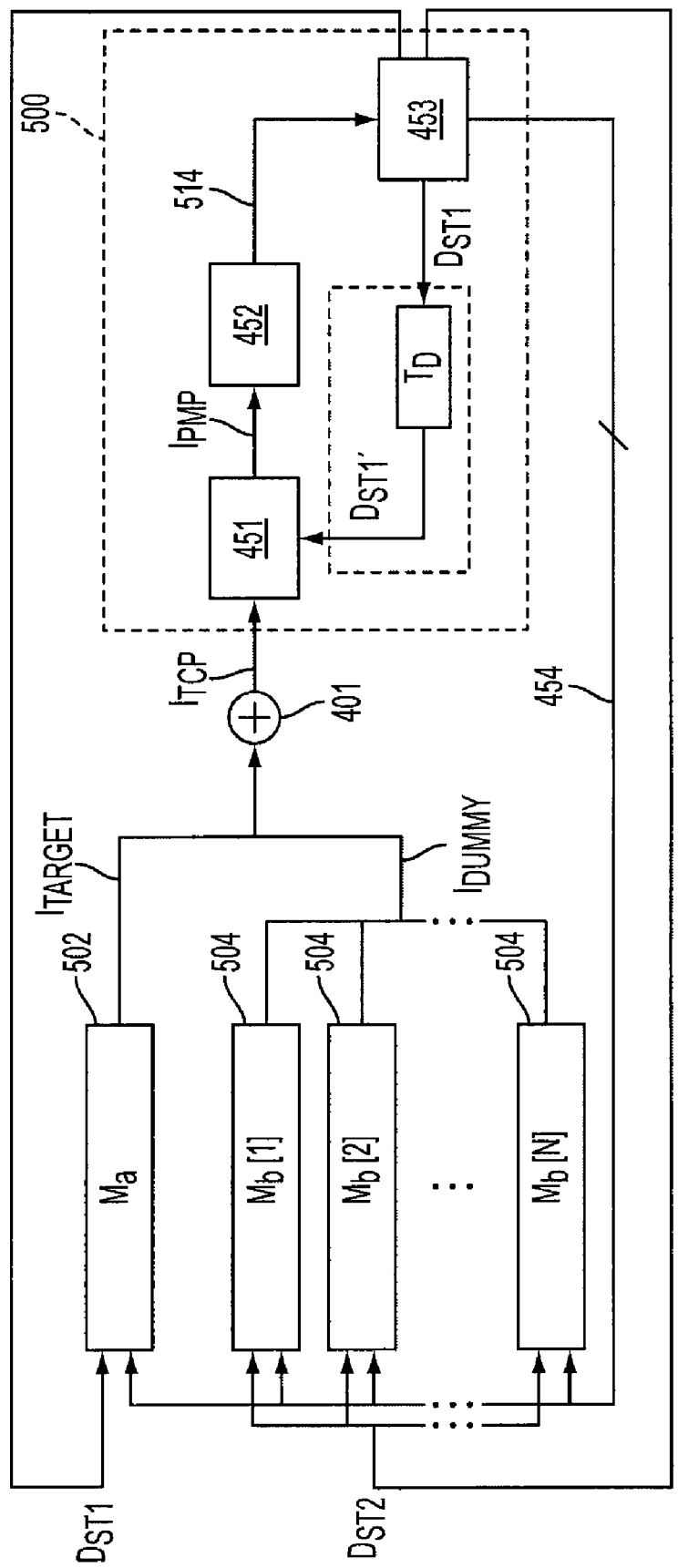
FIG. 5 shows a block diagram of the DAC calibration setup according to an embodiment of the present invention.

The discussion now turns to the several digital stimulus signal schemes that the calibration system 450 may implement. FIG. 5 shows a block diagram of the DAC calibration setup 500 which is similar to the one discussed with respect to FIG. 4, except that the multiplexer 460 is removed and the current source, the current switch, and the weighting network 440 are all incorporated in the CSS elements 502 and 504.

Referring to the CSS element 502, it belongs to the target group for calibration so that it may receive a digital stimulus signal $D_{ST1}$ sent from the calibration logic module 453. After being polarized and scaled, the CSS element 502 may deliver a target output current pulse $I_{TARGET}$ with a magnitude $M_a$. Referring to the N CSS elements 504, they belong to the dummy group and are not prepared for calibration so that they may receive the digital stimulus signal $D_{ST2}$ sent from the calibration logic module 453. After being polarized and scaled, the CSS elements 504 may deliver the dummy output current pulse $I_{DUMMY}$ with a magnitude $N*M_b$. $M_a$ and $M_b$ are the scaled magnitudes of the uniform magnitude $M_O$ of the original output current $I_O$. For example, $M_a$ may be half of the uniform magnitude $M_O$, and $M_b$ may be one fourth of the uniform magnitude $M_O$.

The target output current pulse $I_{TARGET}$ and the dummy output current pulse $I_{DUMMY}$ may join at the output node 401 to form the total current pulse $I_{TCP}$. The calibration demodulation module 451 may receive and demodulate the total current pulse $I_{TCP}$ to form the pre-measurement current pulse $I_{PMP}$. As a result, the DC component of the target output current pulse $I_{TARGET}$ may be properly preserved. The average current/voltage measurement module 452 may then measure the average value of the pre-measurement current pulse $I_{PMP}$ and deliver the measurement result 514 to the calibration logic module 453. The calibration logic module 453 may compare the measurement result 514 with a predefined value to determine a differential value, which may eventually be used to adjust the bias voltage 454 for correcting or compensating any mismatch problem from the target CSS element 502.

The digital stimulus signals $D_{ST1}$ and $D_{ST2}$ may share the same frequency, but the digital stimulus signal $D_{ST2}$ may lag behind the digital stimulus signal $D_{ST1}$ by one fourth of a period or 90 degree in phase. For example, referring to FIG. 6, the digital stimulus signals $D_{ST1}$ and $D_{ST2}$ are two separate digital pulses having a period of four time units T. The digital stimulus signal $D_{ST1}$ may have a high state value during the time units T1 and T2 and a low state value during the time units T3 and T4. Similarly, the digital stimulus signal $D_{ST2}$ may have a high state value during the time units T2 and T3 and a low state value during the time units T4 and T5. As such, the digital stimulus signal $D_{ST2}$ shares the same frequency with the digital stimulus signal $D_{ST1}$, but it lags behind the digital stimulus signal $D_{ST1}$ by one time unit T, which represents one forth of a period or 90 degree in phase. The high state value and the low state value can be positive one and negative one in a differential output system, or a positive one and a zero in a single-ended system.

Figure 6:
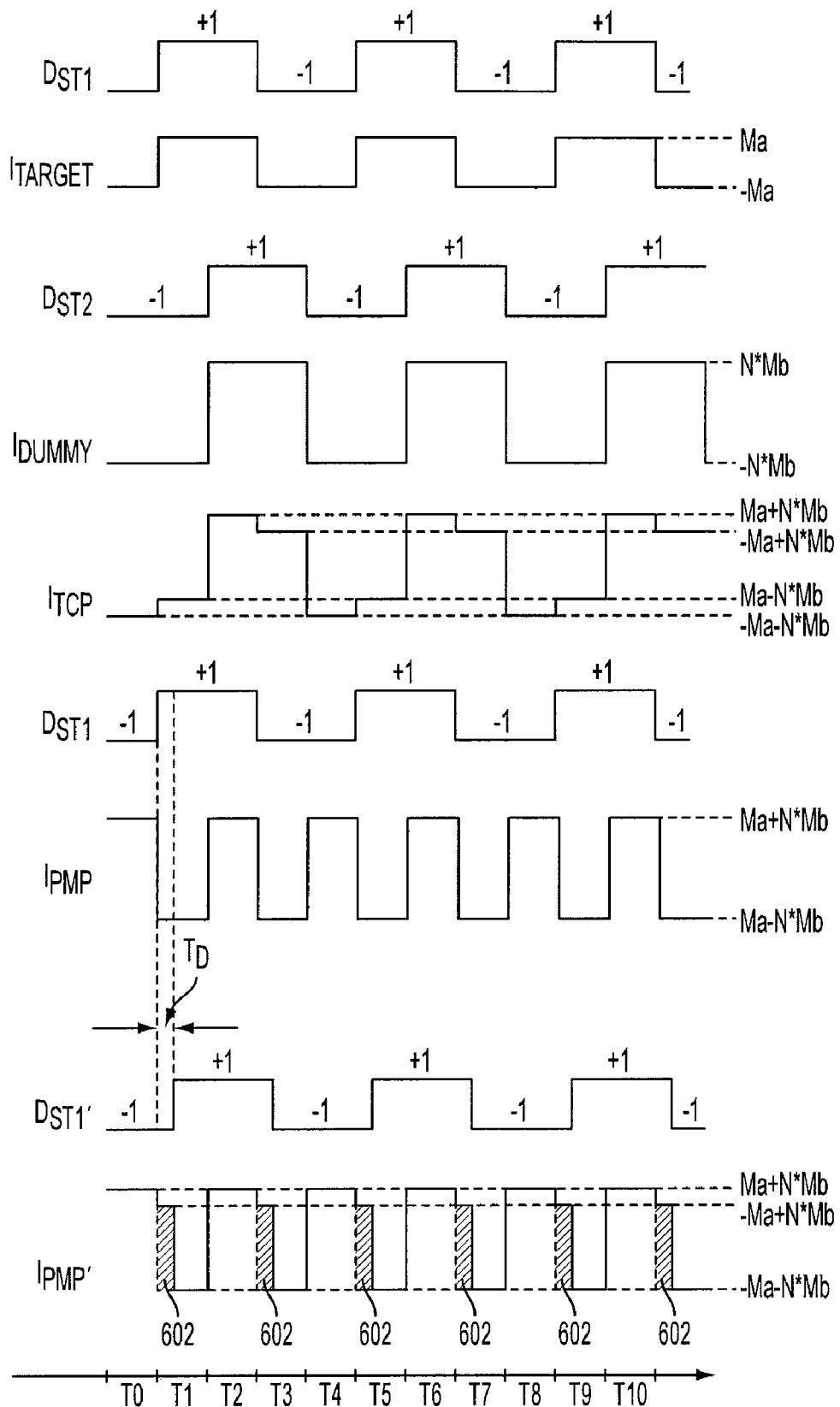
FIG. 6 shows the waveform diagrams of various DAC calibration signals according to various embodiments of the present invention.

After being polarized, the target output current pulse $I_{TARGET}$ may be synchronized with the digital stimulus signal $D_{ST1}$, whereas the dummy output current pulse $I_{DUMMY}$ may be synchronized with the digital stimulus signal $D_{ST2}$. As shown in FIG. 6, the target output current pulse $I_{TARGET}$ may have a positive magnitude $M_a$ during the time units T1 and T2 and a negative magnitude $-M_a$ during the time units T3 and T4. Similarly, the dummy output current pulse $I_{DUMMY}$ may have a positive magnitude $N*M_b$ during the time units T2 and T3 and a negative magnitude $-N*M_b$ during the time units T4 and T5.

When the target output current pulse $I_{TARGET}$ joins the dummy output current pulse $I_{DUMMY}$ at the output node 401, the total current pulse $I_{TCP}$ is formed. As shown in FIG. 6, the total current pulse $I_{TCP}$ may have four magnitudes, which include $M_a+N*M_b$ during the time unit T2, $-M_a+N*M_b$ during the time unit T3, $-M_a-N*M_b$ during the time unit T4, and $M_a-N*M_b$ during the time unit T5.

By applying the digital stimulus signal $D_{ST1}$ to the total current pulse $I_{TCP}$, the calibration demodulation module 451 may filter the total current pulse $I_{TCP}$ to form the pre-measurement current pulse $I_{PMP}$. As shown in FIG. 6, the pre-measurement current pulse $I_{PMP}$ may only have two magnitudes, which include $M_a+N*M_b$ during the time unit T2 and $M_a-N*M_b$ during the time unit T3. Over a full period of the pre-measurement current pulse $I_{PMP}$, the AC component of the dummy output current pulse $N*M_b$ may be removed from the pre-measurement current pulse $I_{PMP}$ because the positive portion $+N*M_b$ during the time unit T2 may cancel the negative portion $-N*M_b$ during the time unit T3. Therefore, the DC component of the target output current pulse $I_{TARGET}$ is preserved such that the average value of the pre-measurement current pulse $I_{PMP}$ is substantially close to $M_a$. By measuring the average value of the pre-measurement current pulse $I_{PMP}$, the average current/voltage measurement module 452 may approximate the target output current pulse magnitude $M_a$.

Due to a potential design limitation, the calibration system 450 may introduce a time delay $T_D$ to the digital stimulus signal $D_{ST1}$ before it can be received by the calibration demodulation module 451. That is, the calibration demodulation module 451 may receive a delayed digital stimulus signal $D_{ST1}'$ instead of the digital stimulus signal $D_{ST1}$. Because the delayed digital stimulus signal $D_{ST1}'$ is not exactly orthogonal to the digital stimulus signal $D_{ST2}$, the calibration stimulus model 451 may not be able to filter out all the AC component of the dummy output current pulse $I_{DUMMY}$. As a result, the pre-measurement current pulse $I_{PMP}'$ may contain several impure portions 602 as shown at the bottom of FIG. 6. These impure portions 602 may affect the accuracy of the average current measurement by adding $(-M_a+N*M_b)T_D/2T$ to the average measurement. Hence, the time delay $T_D$ may distort the calibration by projecting a measurement result that is larger than the actual target output current pulse magnitude $M_a$. In general, the distortion on the calibration process may be directly proportional to the duration of the time delay $T_D$.

Figure 7:
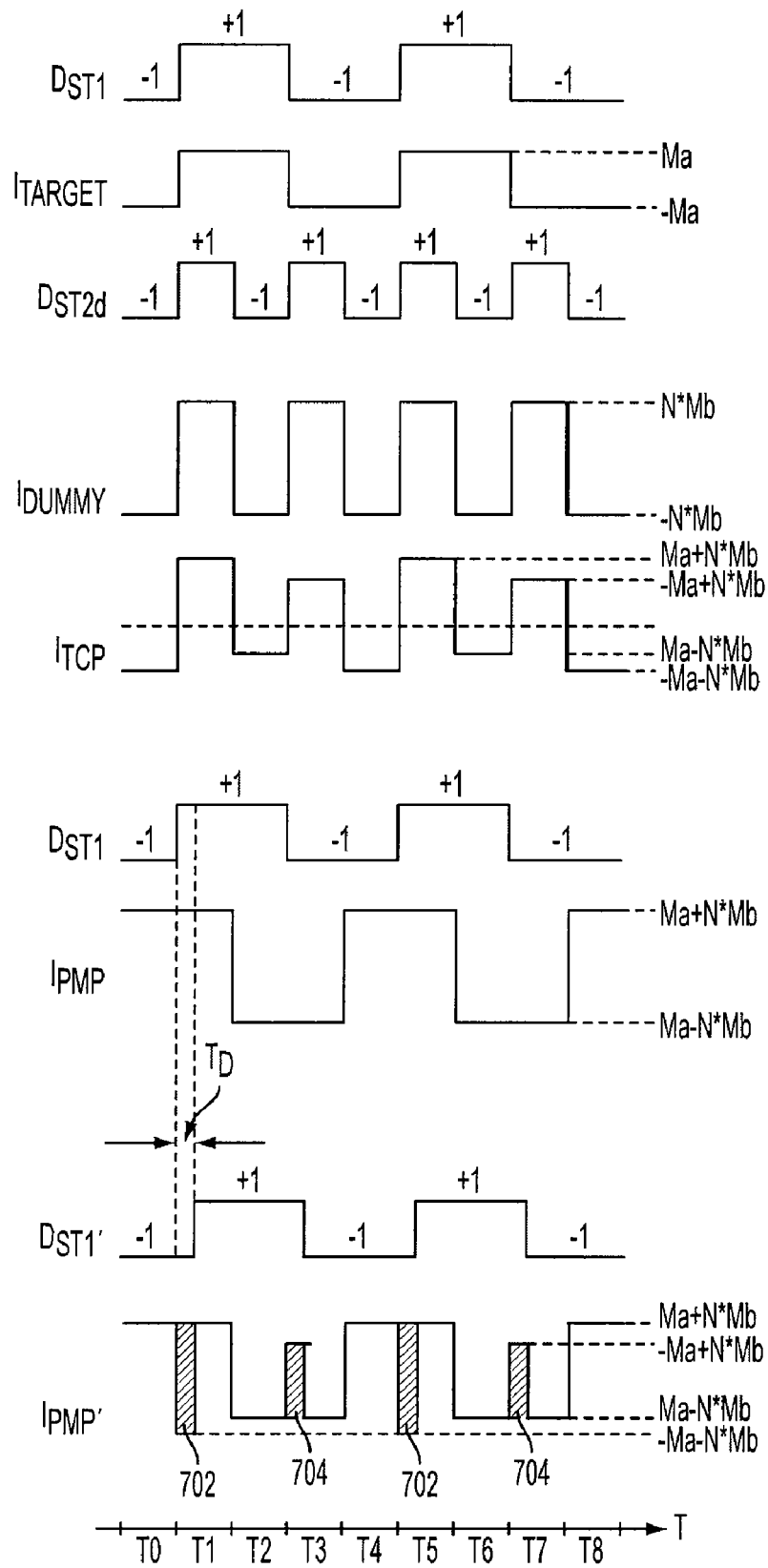
FIG. 7 shows the waveform diagrams of various DAC calibration signals according to various embodiments of the present invention.

The calibration logic module 453 may reduce the distortion by introducing the same time delay $T_D$ to the digital stimulus signal $D_{ST1}$ sent to the target CSS element and the digital stimulus signal $D_{ST2}$ sent to the dummy CSS elements. The calibration logic module 453 may reduce the distortion by deploying a new digital stimulus signal $D_{ST2d}$ to polarize the dummy CSS elements. Generally, while the digital stimulus signal $D_{ST2d}$ is still orthogonal to the digital stimulus $D_{ST1}$, the frequency of the digital stimulus signal $D_{ST2d}$ may double the frequency of the digital stimulus signal $D_{ST1}$. Referring to FIG. 7, the digital stimulus signal $D_{ST2d}$ may have a high state during the time unit T1 and a low state during the time unit T2. Because the digital stimulus signal $D_{ST2d}$ repeats its cycle every two time units instead of every four time units, the frequency of the digital stimulus signal $D_{ST2d}$ is twice the frequency of the digital stimulus signal $D_{ST1}$. Accordingly, while the waveform of the target output current pulse $I_{TARGET}$ stays unchanged, the waveform of the dummy output current pulse $I_{DUMMY}$ doubles its frequency.

At the output node 401, the total current pulse $I_{TCP}$ in FIG. 7 has a waveform different from the one in FIG. 6. In the case where the digital stimulus signal $D_{ST1}$ is identical to the delay digital stimulus signal $D_{ST1}'$, the average value of the pre-measurement current pulse $I_{PMP}$ would be exactly $M_a$ as shown in FIG. 7. Otherwise, the calibration demodulation module 451 may receive the delayed digital stimulus signal $D_{ST1}'$. Because the frequency of the digital stimulus signal $D_{ST2d}$ doubles that of the delay digital stimulus signal $D_{ST1}'$, the impure portions 702 and 704 may only add $M_a*T_D/2T$ to the average current measurement. As a result, there is still a small reduction of the gain in the measured output, but this gain reduction applies to every CSS measurement, and does not affect the purpose of the calibration, which is to equalize all the CSS element output values. More importantly, the impure portions ($-N*M_b$ and $N*M_b$) of the delay pre-measured current pulse $I_{PMP}'$ are completely cancelled out. In light of the time delay aspect of the present invention, the digital stimulus signal $D_{ST2d}$ may produce better calibration result than the digital signal $D_{ST2}$.

The discussion now is turned to the large signal swing of the pre-measurement current pulse $I_{PMP}$ or $I_{PMP}'$. Although the distortion on the average current measurement may be reduced by using the digital stimulus signal $D_{ST2d}$ to polarize the dummy CSS elements, the large signal swings at the pre-measurement current pulse $I_{PMP}$ or $I_{PMP}'$ level may still affect the accuracy of the measurement. For example in FIG. 7, the impure portions 702 may swing from $-M_a-N*M_b$ to $M_a+N*M_b$, producing a signal swing magnitude of $2*(M_a+N*M_b)$. Because of the large signal swing, the measurement unit 452 has to be very accurate over a large input range.

The calibration system 450 may adopt an alternative scheme to reduce the large signal swing of the impure portions while retaining all the design advantages of the scheme described in FIG. 7. More specifically, the dummy CSS elements may be further divided into two groups, each of which can be separately polarized to form a pair of complimentary dummy output current pulses. One aspect of this embodiment is to have the AC component of the pair of complimentary dummy output current pulses cancelled each other at the pre-measurement current pulse $I_{PMP}$ level, such that the signal swing caused by the impure portions of the pre-measurement current pulse $I_{PMP}$ may be substantially reduced.

Figure 8:
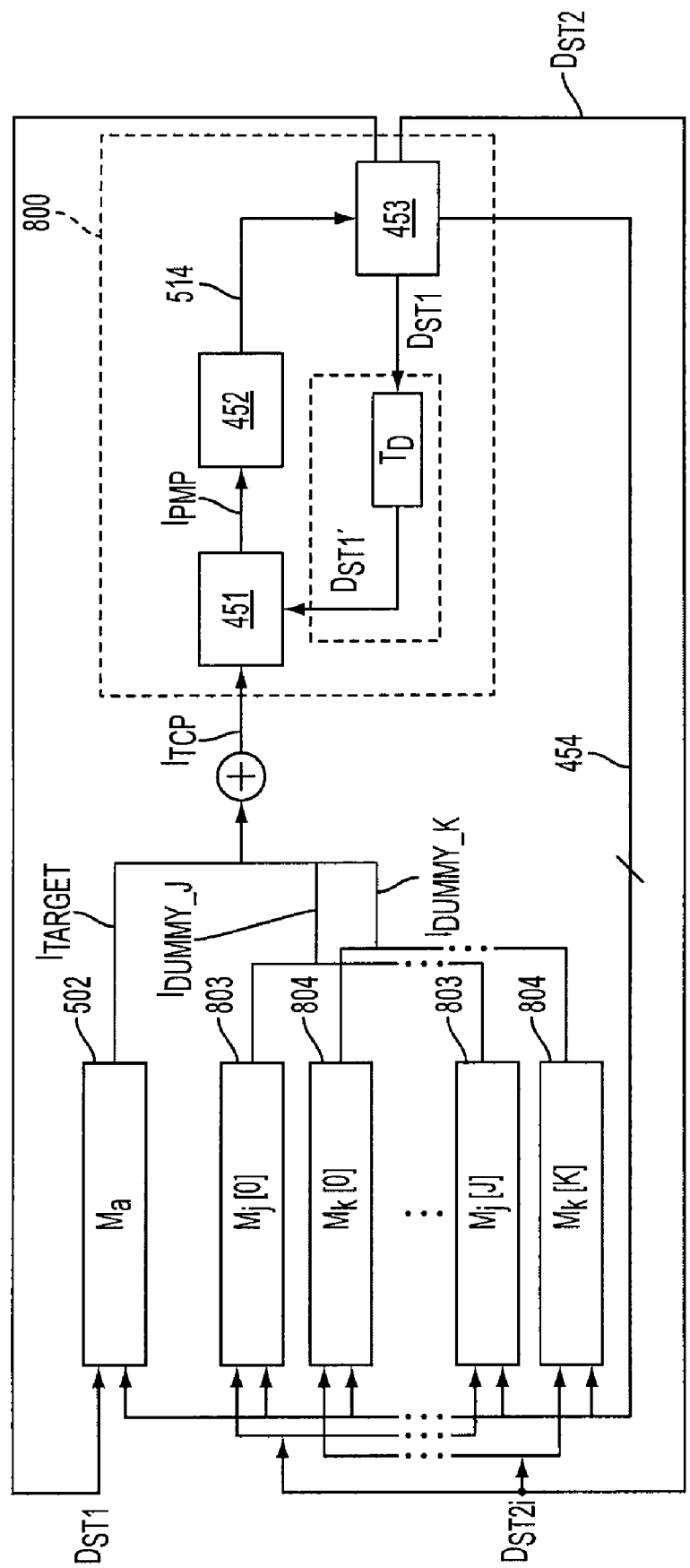
FIG. 8 shows a block diagram of an alternative DAC calibration setup according to another embodiment of the present invention.

For example in FIG. 8, which shows a calibration setup 800 similar to the one discussed with respect to FIG. 5, the dummy CSS elements may be further divided into two groups, with a J group having about J CSS elements 803 and a K group having about K CSS elements 804 such that the sum of J and K equals N. In general, the J group CSS elements 803 may each have a scaled output current magnitude $M_j$ and the K group CSS elements 804 may each have a scaled output current magnitude $M_k$. In order to achieve the desirable cancellation, the value of $J*M_j$ should be substantially close to the value of $K*M_k$.

Although FIG. 8 shows that the J group CSS elements 803 may form a checker board pattern with the K group CSS elements 804, the J group CSS elements 803 and the K group CSS elements 804 may be distributed in different patterns.

Figure 9:
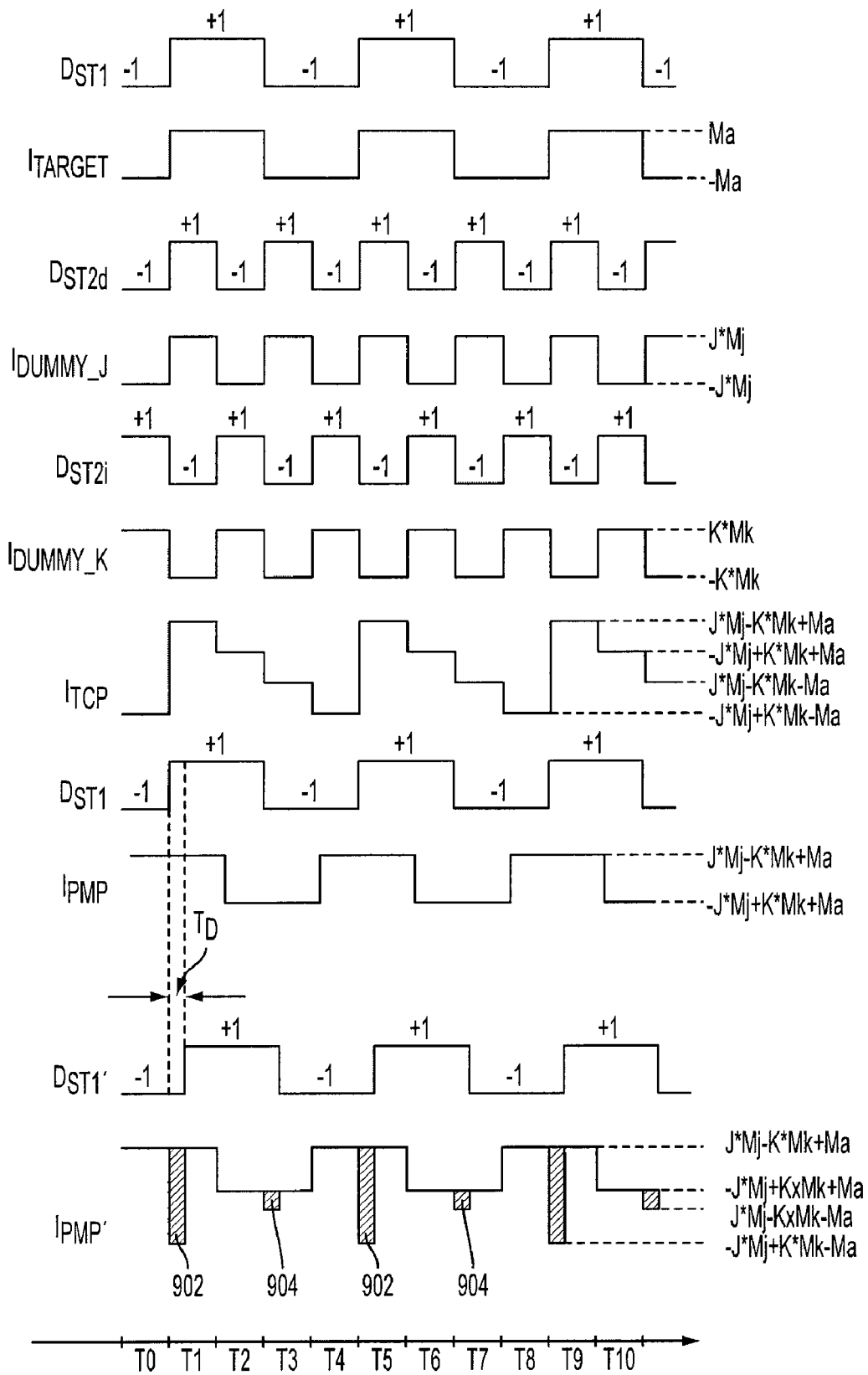
FIG. 9 shows the waveform diagrams of various DAC calibration signals according to various embodiments of the present invention.

Unlike the calibration setup 500 of FIG. 5, the calibration setup 800 may produce three digital stimulus signals instead of two. As shown in FIG. 8, the calibration logic module 453 may produce three digital stimulus signals $D_{ST1}$, $D_{ST2d}$, and $D_{ST2i}$. While the digital stimulus signals $D_{ST1}$ and $D_{ST2d}$ are substantially the same as those discussed with respect to FIGS. 5-7, the digital stimulus signal $D_{ST2i}$ is newly introduced in this embodiment. As shown in FIG. 9, the digital stimulus signal $D_{ST2i}$ may be identical to the digital stimulus signal $D_{ST2d}$ except that it has an opposite polarity in relative to the digital stimulus signal $D_{ST2d}$.

Generally, the digital stimulus signal $D_{ST2i}$ may be generated along with the digital stimulus signal $D_{ST2d}$ by a device with differential outputs, or it may be generated by inverting the digital stimulus signal $D_{ST2d}$. In either situation, both the digital stimulus signals $D_{ST2d}$ and $D_{ST2i}$ should be orthogonal to the digital stimulus signal $D_{ST1}$ and have a frequency that doubles the frequency of the digital stimulus signal $D_{ST1}$.

Referring again to FIG. 8, the calibration module 453 may apply the digital stimulus signal $D_{ST2d}$ to the J group CSS elements 803 and the digital stimulus signal $D_{ST2i}$ to the K group CSS elements 804, or vice versa. Accordingly, the J group CSS elements 803 may be polarized to generate the dummy output current pulse $I_{DUMMY\_J}$ with a magnitude $J*M_j$ and the K group CSS elements 804 may be polarized to generate the dummy output current pulse $I_{DUMMY\_K}$ with a magnitude $K*M_k$.

As shown in FIG. 9, the waveform of the dummy output current pulses $I_{DUMMY\_J}$ and $I_{DUMMY\_K}$ share the same frequency although they have opposite polarities. Moreover, both the dummy output current pulses $I_{DUMMY\_J}$ and $I_{DUMMY\_K}$ are orthogonal to the target output current pulse $I_{TARGET}$, and they both have a frequency that doubles the frequency of the target output current pulse $I_{TARGET}$. When the three output current pulses $I_{DUMMY\_J}$, $I_{DUMMY\_K}$, and $I_{TARGET}$ join at the output node 401, they form the total current pulse $I_{TCP}$, which may have four magnitudes. These four magnitudes may include $J*M_j-K*M_k+M_a$, $-J*M_j+K*M_k+M_a$, $J*M_j-K*M_k-M_a$, and $-J*M_j+K*M_k-M_a$.

After being demodulated by the digital stimulus signal $D_{ST1}$ in the calibration demodulation module 451, the total current pulse $I_{TCP}$ is converted to the pre-measurement current pulse $I_{PMP}$. Because the $I_{TCP}$ magnitudes $J*M_j-K*M_k-M_a$ and $-J*M_j+K*M_k-M_a$ are inverted by the digital stimulus signal $D_{ST1}$, the filtered pre-measurement current pulse $I_{PMP}$ only have two magnitudes $J*M_j-K*M_k+M_a$ and $-J*M_j+K*M_k+M_a$.

With the time delay $T_D$ added to the digital stimulus signal $D_{ST1}$, the delay pre-measurement current pulse $I_{PMP}$ may have the impure portions 902 and 904. The signal swing caused by the impure portion 902 may be from about $J*M_j-K*M_k+M_a$ to about $-J*M_j+K*M_k-M_a$, such that the signal swing magnitude may be about $2*(J*M_j-K*M_k+M_a)$. As discussed, the value $J*M_j$ is supposed to be substantially close to the value $K*M_k$. Accordingly, the signal swing caused by the impure portion 902 is only about $2*M_a$, which is relatively insignificant when compared to the signal swing of $2*(M_a+N*M_b)$ as discussed in FIG. 7.

Similar to the calibration scheme discussed with respect to FIG. 7, the average value of the delay pre-measurement current pulse $I_{PMP}$' only contain a small amount of distortion, but such distortion is independent of the influence of the dummy output currents $I_{DUMMY\_J}$ and $I_{DUMMY\_K}$. As such, this embodiment of the present invention may retain all the design advantages of the scheme discussed with respect to FIG. 7.

Figure 10:
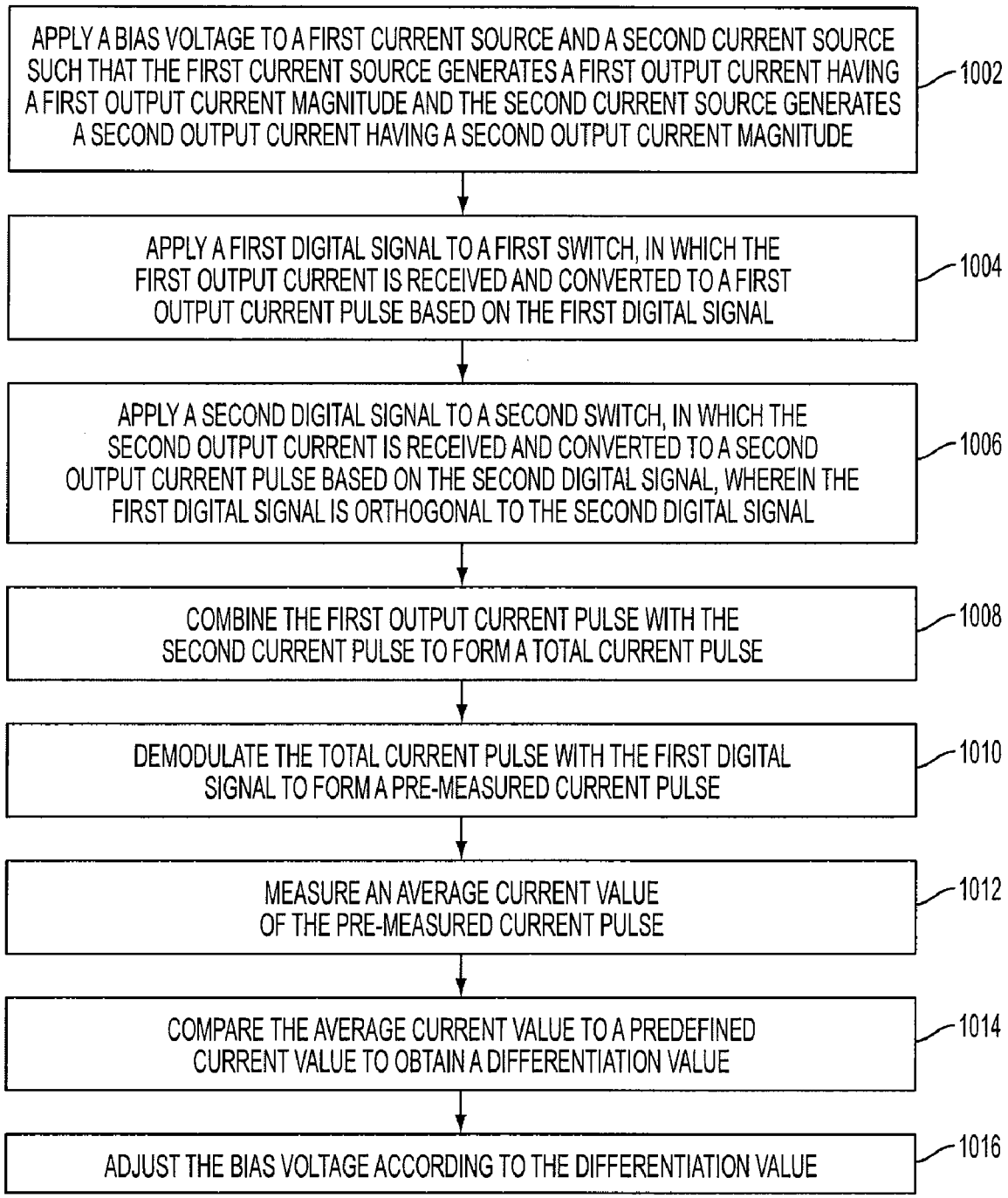
FIG. 10 is a flow chart that illustrates the steps of the calibration process according to an embodiment of the present invention.

FIG. 10 is a flow chart that illustrates the method steps of the calibration process according to an embodiment of the present invention. These method steps are related to the discussion with respect to FIGS. 4 to 9. Although these steps might introduce terminologies different from those in the previous discussion, these steps are consistent with the spirit and concept of the previous discussion and should not be construed otherwise.

In step 1002, a bias voltage is applied to a first current source and a second current source such that the first current source generates a first output current having a first output current magnitude and the second current source generates a second output current having a second output current magnitude. In step 1004, a first digital signal is applied to a first switch, in which the first output current is received and converted to a first output current pulse based on the first digital signal. In step 1006, a second digital signal is applied to a second switch, in which the second output current is received and converted to a second output current pulse based on the second digital signal, where the first digital signal is orthogonal to the second digital signal. In step 1008, the first output current pulse is combined with the second current pulse to form a total current pulse. In step 1010, the total current pulse is demodulated with the first digital signal to form a pre-measured current pulse. In step 1012, an average current value of the pre-measured current pulse is measured. In step 1014, the average current value is compared to a predefined current value to obtain a differential value. In step 1016, the bias voltage is adjusted according to the differential value.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A digital-to-analog converter (DAC) calibration system comprising:
   a multiplexer receiving a digital input sequence and outputting a first digital signal and a plurality of second digital signals, wherein the first digital signal is orthogonal to the second digital signals;

a first current source switch (CSS) element having:
  a first current source configured to generate a first output current having a first output current magnitude controlled by a bias voltage applied to the first current source;
  a first current switch configured to receive the first digital signal and convert the first output current received from the first current source to a first output current pulse based on the first digital signal; and
  a first weighting network configured to scale the first output current pulse based on a predetermined first weighting factor;
a plurality of second current source switch (CSS) elements each having:
  a second current source configured to generate a second output current controlled by the bias voltage applied to the second current source;
  a second current switch configured to receive the respective second digital signal and convert the second output current received from the second current source to a second output current pulse based on the respective second digital signal; and
  a second weighting network configured to scale the second output current pulse based on a predetermined second weighting factor;
an output node coupled to the first weighting network and the second weighting networks, receiving the first output current pulse and the second current pulses, the combination of which forms a total output current pulse;
a resistive element coupled between the output node and a ground source, conducting the total output current pulse to the ground source to produce an output voltage on the output node;
a first calibration module configured to receive the first digital input and convert the output voltage to a target voltage having an average output voltage value that reflects the first output current magnitude;
an average measurement module coupled to the first calibration module and configured to measure the average output voltage value; and
a second calibration module coupled to the average measurement module and configured to compare the average output voltage value with a predefined voltage value and adjust the bias voltage to control the first current source and the second current sources.

2. The DAC calibration system of claim 1, wherein the first digital signal has a first frequency and the second digital signals have a second frequency, such that the second frequency is different from the first frequency.

3. The DAC calibration system of claim 2, wherein the second digital signals is divided into a nominal group having a nominal polarity and a complimentary group having a complimentary polarity such that the nominal polarity is in opposite of the complimentary polarity.

4. The DAC calibration system of claim 1, wherein the second digital signals is 90 degree lagging or leading the first digital sequence.

5. The DAC calibration system of claim 1, wherein the first calibration module is a calibration demodulation module and the second calibration module is a logic module.

6. A digital-to-analog converter (DAC) calibration system comprising:
  a first current source configured to generate a first output current having a first output current magnitude controlled by a bias voltage applied to the first current source;
  a first switch configured to receive a first digital signal and convert the first output current received from the first current source to a first output current pulse based on the first digital signal;
  a second current source configured to generate a second output current having a second output current magnitude controlled by the bias voltage applied to the second current source;
  a second switch configured to receive a second digital signal and convert the second output current received from the second current source to a second output current pulse based on the second digital signal;
  an output node coupled to the first switch and the second switch, and for receiving the first output current pulse and the second output current pulse, the combined first and second current pulses forming a total current pulse;
  a first calibration module configured to receive the first digital signal and convert the total current pulse received from the output node to a target current pulse having an average current value;
  an average current measurement module coupled to the first calibration module and configured to measure the average current value; and
  a second calibration module coupled to the average current measurement module and configured to compare the average current value with a predefined current value and adjust the bias voltage to control the first current source and the second current source.

7. The DAC calibration system of claim 6, wherein the first digital signal is orthogonal to the second digital signal.

8. The DAC calibration system of claim 6, wherein the second digital signal is 90 degree leading or lagging the first digital.

9. The DAC calibration system of claim 6, wherein the first digital signal has a first frequency and the second digital signal has a second frequency such that the second frequency is different from the first frequency.

10. The DAC calibration system of claim 9, further comprising:
  an inverting device configured to invert the second digital signal to form a third digital signal;
  a third current source configured to generate a third output current having a third output current magnitude controlled by the bias voltage applied to the third current source; and
  a third switch configured to receive the third digital signal and convert the third output current received from the third current source to a third output current pulse based on the third digital signal, wherein the third output current pulse joins the first and second current pulses at the output node to form the total current pulse.

11. The DAC calibration system of claim 6, wherein the average current value of the target current pulse is substantially close to the first output current magnitude of the first output current.

12. The DAC calibration system of claim 9,
  wherein the second current source comprises a plurality of second current source devices, and
  wherein the second switch further comprising a plurality of second switch devices divided into a nominal group and a complementary group.

13. The DAC calibration system of claim 12,
  wherein the second digital signal comprises a nominal sequence and a complimentary sequence such that the complimentary sequence has an opposite polarity in relative to the nominal sequence, wherein the nominal group of the second switch devices is configured to receive the second digital signal with the nominal sequence, and wherein the complementary group of the second switch devices is configured to receive the second digital signal with the complementary sequence.

14. The DAC calibration system of claim 6, further comprising a first weighting network coupled between the first switch and the output node and a second weighting network coupled between the second switch and the output node.

15. The DAC calibration system of claim 6, wherein the first calibration module is a calibration demodulation module and the second calibration module is a logic module.

16. A method for calibrating a digital-to-analog converter (DAC), comprising the steps of:

applying a bias voltage to a first current source and a second current source such that the first current source generates a first output current having a first output current magnitude and the second current source generates a second output current having a second output current magnitude;

applying a first digital signal to a first switch, in which the first output current is received and converted to a first output current pulse based on the first digital signal;

applying a second digital signal to a second switch, in which the second output current is received and converted to a second output current pulse based on the second digital signal, wherein the first digital signal is orthogonal to the second digital signal;

combining the first output current pulse with the second current pulse to form a total current pulse;

filtering the total current pulse with the first digital signal to form a pre-measured current pulse;

measuring an average current value of the pre-measured current pulse;

comparing the average current value to a predefined current value to obtain a differentiation value; and adjusting the bias voltage according to the differentiation value.

17. The method of claim 16, wherein the second digital signal is 90 degree leading or lagging the first digital signal.

18. The method of claim 16, wherein the first digital signal has a first frequency and the second digital signal has a second frequency such that the second frequency is different from the first frequency.

19. The method of claim 18, wherein the second digital signal comprises a nominal sequence and a complimentary sequence such that the complimentary sequence has an opposite polarity in relative to the nominal sequence.

20. The method of claim 16, wherein the average current value of the pre-measured current pulse is substantially close to the first output current magnitude of the first output current.

* * * * *